United States Patent [19]

Pryor et al.

[11] Patent Number: 4,929,516
[45] Date of Patent: May 29, 1990

[54] SEMICONDUCTOR DIE ATTACH SYSTEM

[75] Inventors: Michael J. Pryor, Woodbridge; Julius C. Fister, Hamden; Narendra N. Singhdeo, New Haven; Deepak Mahulikar, Meriden; Satyam C. Cherukuri, West Haven, all of Conn.

[73] Assignee: Olin Corporation, New Haven, Conn.

[21] Appl. No.: 826,808

[22] Filed: Feb. 10, 1986

Related U.S. Application Data

[63] Continuation-in-part of Ser. No. 740,789, Jun. 8, 1985, abandoned, which is a continuation-in-part of Ser. No. 711,868, Mar. 14, 1985, abandoned.

[51] Int. Cl.⁵ .................................. B32B 15/00
[52] U.S. Cl. .................................. 428/620; 428/621; 428/641; 428/664; 428/669; 428/670; 428/672; 428/673; 428/678
[58] Field of Search .............. 357/65, 67, 71, 80, 357/81; 428/678, 615, 620, 641, 627, 621, 630, 632, 633, 670, 672, 673, 680, 668, 669, 664; 29/569 R, 576 R, 589, 590, 591; 420/557

[56] References Cited

U.S. PATENT DOCUMENTS

| | | | |
|---|---|---|---|
| 2,763,822 | 9/1956 | Frola et al. | 317/234 |
| 2,922,092 | 1/1960 | Gazzara et al. | 428/620 |
| 2,971,251 | 2/1961 | Willemse | 29/195 |
| 3,159,462 | 12/1964 | Kadelburg | 428/620 |
| 3,160,798 | 12/1964 | Lootens et al. | 428/620 |
| 3,221,219 | 11/1965 | Emeis et al. | 428/620 |
| 3,331,996 | 7/1967 | Green | 428/620 |
| 3,454,374 | 7/1969 | Domin | 428/642 |
| 3,503,721 | 3/1970 | Lupfer | 420/557 |
| 3,593,412 | 7/1971 | Foote | 29/589 |
| 3,620,692 | 11/1971 | Franklin et al. | 428/620 |
| 3,645,785 | 2/1972 | Hentzschel | 428/641 |
| 3,729,820 | 5/1973 | Ihochi et al. | 174/525 |
| 3,859,715 | 1/1975 | Duffek et al. | 29/588 |
| 4,229,758 | 10/1980 | Ikari | 357/74 |
| 4,480,261 | 10/1984 | Hattori et al. | 357/71 |
| 4,487,638 | 12/1984 | Hoge | 142/24 |
| 4,515,898 | 5/1985 | Davis et al. | 501/15 |
| 4,592,794 | 6/1986 | Davis et al. | 156/89 |
| 4,610,934 | 9/1986 | Boecker et al. | 428/621 |
| 4,656,499 | 4/1987 | Butt | 357/74 |

FOREIGN PATENT DOCUMENTS

| | | |
|---|---|---|
| 904567 | 7/1922 | Canada . |
| 667024 | 7/1963 | Canada . |
| 676283 | 12/1963 | Canada . |
| 700474 | 12/1964 | Canada . |
| 707458 | 4/1965 | Canada . |
| 755785 | 3/1967 | Canada . |
| 70435 | 1/1983 | European Pat. Off. . |
| 22163 | 2/1979 | Japan .............. 428/620 |
| 15235 | 2/1980 | Japan .............. 428/620 |
| 56-114338 | 9/1981 | Japan . |
| 58-151036 | 9/1983 | Japan . |
| 59-107527 | 6/1984 | Japan . |
| 59-151437 | 8/1984 | Japan . |
| 60-41234 | 3/1985 | Japan . |
| 60-235430 | 11/1985 | Japan . |

OTHER PUBLICATIONS

D. Olsen et al., Chemical Abstracts 96: 56464d, "Improved Lost Effectiveness and Product Reliability through Solder Alloy Development", 1981.

Chemical Abstracts 98: 26293w, "Semiconductor Device", Dec. 1980.

"Die Bonding & Packaging Sealing Materials", by Singer in *Semiconductor International*, Dec. 1983.

"A New Metal System for Die Attachment" by Winder et al. in *Proc. Tech. Program, Annu. Int., Electron. Packag. Conf. 2nd*, 1982, pp. 715–727.

*Primary Examiner*—John J. Zimmerman
*Attorney, Agent, or Firm*—Gregory S. Rosenblatt; Paul Weinstein

[57] ABSTRACT

A semiconductor die attach system adapted for attaching a semiconductor die to a substrate is provided. A metallic buffer component for dissipating thermal stresses is disposed between the substrate and the semiconductor die to dissipate stresses created from thermal cycling of the substrate and the die. The metallic buffer component is sealed between the substrate and the die with a silver-tin sealing composition. A bonding material may be used alone to bond a die to a substrate and dissipate stresses from thermal cycling.

6 Claims, 2 Drawing Sheets

SEMICONDUCTOR DIE ATTACH SYSTEM

This application is a Continuation-In-Part of Ser. No. 740,789, filed June 3, 1985, by Michael J. Pryor et al., for "Semiconductor Die Attach System" (now abandoned) which in turn is a Continuation-In-Part of Ser. No. 711,868, filed Mar. 14, 1985, by Michael J. Pryor et al., for "Semiconductor Die Attach System" (now abandoned).

This application relates to U.S. Pat. No. 4,704,626, entitled "Graded Sealing Systems for Semiconductor Package" by Mahulikar et al., filed July 8, 1985, which discloses a semiconductor package having a graded interface zone formed between two fused sealing glasses that are disposed between a leadframe and a substrate or cover member. The zone accomodates and relaxes thermal stresses formed from significant mismatch between the coefficients of thermal expansion of the leadframe and the cover or base member.

While the invention is subject to a wide range of applications, it is particularly suited for semiconductor die attachment and will be particularly described in that connection. More specifically, a metallic buffer component is disposed between a metallic substrate and a semiconductor die to dissipate thermal or mechanical stresses caused by thermal exposure.

Semiconductor dies are typically attached to hermetically sealed packages with a bonding composition of various metals or polymers. These bonding compositions usually melt at a relatively high temperature in order that they can withstand the processing temperatures required to hermetically seal a package, i.e. above 400° C. Typical bonding materials and techniques are disclosed in articles entitled "Die Bonding & 30 Packaging Sealing Materials", by Singer in *Semiconductor International*, Dec. 1983 and "A New Metal System for Die Attachment" by Winder et al. in *Proc. Tech. Program - Annu. Int.*, Electron. Packag. Conf. 2ND, 1982, pages 715-727. Also U.S. Pat. No. 3,593,412 discloses a unique attachment system.

In a typical assembly operation, a semiconductor die or integrated circuit is placed in a cavity of a base member containing the bonding composition. The base is then heated to melt the bonding composition and adhere the die within the cavity of the base. Subsequently, the cavity is covered with a lid and heat is again applied to seal the lid to the base and form an hermetic enclosure for the die. Lid sealing temperatures are typically about 400° C. to about 450° C. Examples of this type of process are disclosed in U.S. Pat. Nos. 4,229,758 and 4,487,638.

When the base and lids of the hermetically sealed semiconductor packages are formed of metal, such as selected copper alloys, the semiconductor die, typically silicon, is directly attached to the metallic substrate. Unlike the low degree of mismatch between coefficients of thermal expansion (CTE) of the components and the die which is common to the conventional ceramic packages, there is a very large mismatch betwen the coefficients of thermal expansion of the silicon and the metallic substrates, i.e. about 100 to about $130 \times 10^{-7}$ in/in/°C. By contrast, the mismatch in coefficients of thermal expansion of alumina and silicon is only about $15 \times 10^{-7}$ in/in/°C.

The mismatch of CTE results in the formation of large strains and resulting thermal stresses during thermal cycling. For example, when a silicon die is attached to a metal substrate with a conventional gold-2% silicon sealing metal, it is processed at a temperature of about 400° C. After the die is attached to the substrate, they are cooled down to room temperature. Very often, thermal stress caused by the large mismatch in their CTE causes the die to either crack or separate at the interface from the substrate.

The problem from a large mismatch in CTE was demonstrated in a number of experiments where a silver backed, silicon die was directly attached to a gold plated, copper alloy substrate having a coefficient of thermal expansion of about $170 \times 10^{-7}$ in/in/°C. The sealing or bonding materials were either conventional gold-2% silicon die attach alloys or a solder comprised of about 25% silver, 10% antimony and the balance tin. Using the gold-2% silicon, attachment of the silver backed, silicon die to the copper alloy substrate was unsuccessful because the die typically fractured on cooling to room temperature because of the large mismatch in the coefficients of thermal expansion between the die and the copper base alloy, i.e. about $120 \times 10^{-7}$ in/in/°C.

By contrast, die attachment with the more compliant solder was successful. However, the die did start to fracture after five cycles of thermal shock testing wherein the device was heated from room temperature to 150° C. in a liquid and subsequently cooled to $-65°$ C. in a liquid. The die attach must withstand this type of thermal shock testing for at least 15 cycles to meet MIL-STD-883B, method 1011.3, condition C.

It is a problem underlying the present invention to provide a semiconductor die attachment system for attaching a semiconductor die to a substrate which is able to withstand the stresses resulting from thermal cycling of the die and substrate.

It is an advantage of the present invention to provide a semiconductor die attach system and process of attaching the system which obviates one or more of the limitations and disadvantages of the described prior arrangements.

It is a further advantage of the present invention to provide a semiconductor die attach system and process of attaching the system which is able to dissipate thermal stresses formed between a semiconductor die and a substrate.

It is a yet further advantage of the present invention to provide a semiconductor die attach system and process of attaching the system wherein a buffer component disposed between a semiconductor die and a substrate provides a stress relaxation path to dissipate thermal stresses.

It is another advantage of the present invention to provide a semiconductor die attach system and process of attaching the system wherein the buffer component is a silver-tin alloy.

It is still another advantage of the present invention to provide a semiconductor die atttach system and process of attaching the system wherein the buffer component is a nickel-iron strip bonded with a silver-tin alloy.

Accordingly, there has been provided a semiconductor die attach system and process of attaching the system adapted for attaching a semiconductor die to a metal or metal-ceramic substrate. In one embodiment, a metallic buffer component for dissipating thermal stresses is disposed between the substrate and the semiconductor die to dissipate stresses created by thermal cycling of the substrate and the die. The metallic component is preferably sealed between the substrate and the die with a silver-tin sealing composition. In another embodiment, a silver-tin sealing composition may be used alone to bond a die to a substrate and dissipate stresses from thermal cycling.

The invention and further developments of the invention are now elucidated by means of the preferred embodiments in the drawings.

IN THE DRAWINGS

Figure 1:
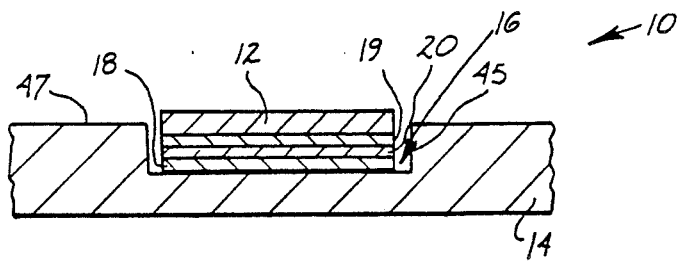
FIG. 1 illustrates a semiconductor die attach system including a buffer layer in accordance with the present invention.

A semiconductor die attach system 10 for attaching a semiconductor die 12 to a metal or metal-ceramic substrate 14 is illustrated in FIG. 1. Structure 16 is disposed between the substrate 14 and the die 12 for dissipating thermal stress caused by thermal cycling. Seal components 18, 19 attach the thermal stress dissipating structure to both the metallic substrate 14 and the semiconductor die 12.

The present invention is primarily directed to forming a semiconductor package wherein the substrate or base is formed of a metal having a relatively high coefficient of thermal expansion (CTE) in the area of about $170 \times 10^{-7}$ in/in/°C. The semiconductor die which is to be attached to the substrate typically has a much lower coefficient of thermal expansion of about $50 \times 10^{-7}$ in/in/°C. The semiconductor die is usually attached to the base by a gold-silicon alloy at about 400° C. or a solder at about 300° C. However, it has been found that the semiconductor die may be attached to the substrate with a sealing or bonding material of an alloy formed of from about 20 to about 40 wt. % silver and about 80 to about 60 wt. % tin. Preferably, the composition of the sealing material would be about 25 to about 35 wt. % silver and about 75 to about 65 wt. % tin. The sealing material would be used at a temperature range of about 350° C. to about 450° C. and preferably at about 390° C. to about 410° C.

Another bonding material consists essentially of about 5 to about 20 wt. % copper and the balance essentially indium. Preferably, the composition of this alloy consists essentially of about 5 to about 13 wt. % copper and the balance essentially indium. Still another bonding material consists essentially of about 2 to about 20 wt. % tin and the balance essentially lead. Preferably, the composition consists essentially of about 4 to about 8 wt. % tin and the balance essentially lead.

With a silver-tin sealing material and with the other bonding materials, the surface of the die to which it is attached requires an oxidation resistant layer, as described below, because the silver-tin or other bonding materials do not wet the silicon or other typical materials of which the die is formed. In either case, die fracture typically occurs on cooling to room temperature because of the large mismatch in the coefficients of thermal expansion between the base and the die.

The present invention overcomes this problem by inserting a thin metallic or non-metallic buffer component between the substrate and the die. The buffer dissipates the thermal stresses caused by the strains which are created as the die and substrate are cooled down to room temperature. The buffer preferably has a coefficient of thermal expansion which is much closer to the die than to the substrate. Then, as the die attach system begins to cool down, the strains caused by the mismatch in coefficients of thermal expansion occur between the buffer and the substrate instead of between the buffer and the die where the coefficients of thermal expansion are more closely matched. The advantage to locating the larger differential in coefficients of thermal expansion between the metal buffer and the metal substrate is that the metal to metal bond at the buffer-substrate interface is typically ductile and better able to withstand stresses and deformation. On the other hand, it is important to reduce stresses and deformation at the interface of the buffer and the die because the semiconductor material is very brittle and not able to withstand any significant deformation. In fact, any stresses between the brittle semiconductor material and the metal buffer is likely to cause cracking of the semiconductor material or separation at the die-substrate interface.

Referring to FIG. 1, the component for dissipating thermal stress preferably comprises a thin, buffer component 20 of a controlled-expansion alloy having a thickness of about 1 to about 20 mils. Preferably, the thickness of the buffer is between about 2 to about 8 mils. It is important that the buffer is relatively thin because it is designed to provide a path of stress relaxation between the semiconductor device 12 and the substrate 14. Since both the semiconductor device and the substrate 14 are relatively thick and rigid, it is important that the buffer component 20 be relatively thin in order that it provide the flexibility and deformation necessary to carrying out its stress relaxation function. In fact, the buffer component may deform into the plastic region to compensate for the strains generated during the cooling period after die attachment. However, even radical deformation of this nature does not significantly effect the operation of the semiconductor device as long as the latter neither cracks nor separates at its interface with the buffer component.

The buffer component also has a coefficient of thermal expansion of between about $35 \times 10^{-7}$ to about $100 \times 10^{-7}$ in/in/°C. Preferably, the buffer component has a CTE of about $40 \times 10^{-7}$ to about $80 \times 10^{-7}$ in/in/°C. In general, it is desirable that the coefficient of thermal expansion of the buffer component be compatible and relatively close to the CTE of the semiconductor die. The buffer component may be constructed of a metal or alloy or ceramic having a low CTE selected from the group consisting of tungsten, rhenium, molybdenum, alloys thereof, and nickel-iron alloys and ceramics. Several examples of particular nickel-iron alloys include 42 Ni-58 Fe, 64 Fe-36 Ni and 54 Fe-28Ni-18 Co. It is also within the terms of the present invention to form the buffer component of any metal or alloy which is able to meet the requirement for a suitable coefficient of thermal expansion as set out hereinabove.

Figure 3:
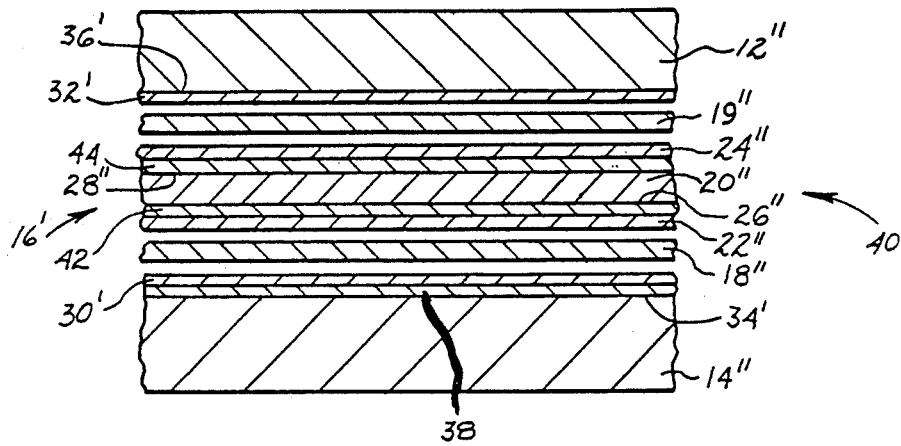
FIG. 3 illustrates a semiconductor die attach system incorporating a buffer layer, barrier layers and oxidation resistant layers.

As illustrated in FIG. 3, in order for the material of the buffer component 20" to form a strong seal with the seal or bonding components 18", 19", it is often necessary to form first and second barrier layers 42 and 44 on opposing surfaces 26" and 28" of the buffer component. Throughout the specification, primed, double primed, triple primed and quadruple primed reference numerals indicate components which are substantially the same as the components identified by the same unprimed reference numerals. The barrier layer is typically formed of a material from the group consisting of nickel, cobalt and alloys thereof. However, it is also within the terms of present invention to form the barrier layer of any suitable metal or alloy which prevents interdiffusion between the buffer material and the oxidation resistant layer formed on the barrier layer as described directly below. The barrier layer also enhances the bonding of the oxidation resistant layer, described hereinbelow to the buffer or substrate. The barrier layer is applied by any conventional means such as electroplating to thickness of about 1.5 to about 10 microns. Preferably, the thickness of the barrier layer is about 2 to about 3 microns.

Oxidation resistant layers 22" and 24" are formed on the barrier layers 42 and 44 respectively. The oxidation resistant layers are typically formed of a material selected from the group consisting of gold, silver, palladium, platinum and alloys thereof. These metals are particularly chosen for their ability to resist oxidation at the high sealing temperatures to which they will be subjected. Typically they are plated onto the barrier layer at a thickness of about 1.5 to about 10 microns. Preferably, the thickness of the oxidation resistant layer is about 2 to about 3 microns. It is within the scope of the present invention to plate an oxidation resistant layer directly onto a desired surface without an intermediate barrier layer.

The substrate 14" may be formed of a metal or alloy but may be formed of any other material such as a ceramic or a cermet having a high coefficient of thermal expansion of more than about $140 \times 10^{-7}$ in/in/°C. Typically, the substrate material has a coefficient of thermal expansion of about $160 \times 10^{-7}$ in/in/°C. As with the buffer 20", it is desirable to form a barrier layer 38 on the surface 34' of the substrate 14". This barrier layer is formed of materials substantially the same as those mentioned with regard to the barrier layers 42 and 44 on the buffer 20". Further, an oxidation resistant layer 30' may be formed on the barrier layer 38. The layer 30' is formed of the same types of materials as selected for the layers 22" and 24" on the buffer 20".

The seal or bonding components 18, 19 is a sealing material such as an alloy having a melting point of less than about 450° C. Typically, the seal is an alloy selected from the group consisting of gold-silicon, gold-tin, silver-tin and silver-antimony-tin. Most commonly, the seal material is a gold-2% silicon which melts at about 363° C. However, it has been found that a silver-tin alloy provides an excellent, relatively unexpensive sealing material. The sealing material is preferably formed of from about 20 to about 40 wt. % silver and about 80 to about 60 wt. % tin. Preferably, the composition of the sealing material would be about 25 to about 35 wt. % silver and about 75 to about 65 wt. % tin. This material would be used at a temperature range of about 350° C. to about 450° C. and preferably at about 390° to about 410° C. An important quality of the sealing material is its ability to bond to the substrate, the buffer component and the semiconductor die. In order to enhance this bonding, each of the components typically has a oxidation resistant layer as mentioned hereinabove.

The semiconductor die 12 is typically formed of a material from the group consisting of silicon, gallium arsenide, silicon carbide and combinations thereof. In order for the die 12 to be sealed to seal component 19, an oxidation resistant layer may be disposed on the surface of the die. This layer is selected of any of the materials which are used to form the oxidation resistant layer on the buffer component. Preferably, this material would be the same as the other oxidation resistant layers used throughout the die attach system.

To further understand the present invention, an explanation of the process by which the semiconductor die is attached to the buffer component 16' and metal substrate is provided herein with reference to FIG. 3. The substrate 14" and buffer 20", preferably have a barrier layer and a oxidation resistant layer formed on their surfaces by any desired process, such as electroplating. The die 12" typically has an oxidation resistant layer 32' on the surface which is to be bonded. The base 14" is first heated on a stage to a temperature of about 365° to about 400° C. This occurs in an inert or reducing atmosphere to prevent oxidation of the substrate. The reducing atmosphere is commonly nitrogen-4% hydrogen while the inert atmosphere is typically either nitrogen, argon, helium or neon. However, it is also within the terms of the present invention to form these types of atmospheres with other conventional gasses.

Once the substrate has been heated to the desired temperature, a strip of the seal component 18", preferably the size of the die 12" is disposed on the surface of the oxidation resistant layer 30' Then the buffer structure 16' is stacked onto the material 18". Then a strip of material 19" essentially the same size as that disposed between the substrate and buffer component is disposed on top of the buffer component. Finally, the semiconductor die is placed on the seal component 19" so that its oxidation resistant layer 32' is in contact with that seal component 19". The entire assembly is heated until the seal component melts and bonds the entire structure together. Typically, the semiconductor die is moved or scrubbed on the seal component 19" to ensure proper wetting of the layer 32' so that the die is securely bond to the buffer. Finally, the sealed assembly is removed from the heat and cooled to room temperature. Standard interconnection techniques may be applied as required to connect the semiconductor die to a lead frame.

Although the invention preferably includes a sealing component 18 between the substrate and the buffer 20, it is also within the terms of the present invention to eliminate the sealing component 18 and spot weld the buffer directly to the substrate 14. This may be accomplished by applying heat and pressure for the necessary time to achieve a degree of melting sufficient to attain solid state diffusion to bond the buffer directly to the substrate. This may further be accomplished without a barrier layer between these components. An embodiment of this scope would be illustrated in FIG. 1 without the bonding layer 19.

Referring to the embodiment as shown in FIG. 1, a basic die attach system 10 embodying the concepts of the present invention is set out. The component 16 for dissipating thermal stress preferably comprises a thin buffer 20 of a controlled-expansion alloy as described previously in the specification.

The bonding or sealing components 18, 19 are selected from a bonding material such as an alloy having a melting point of less than about 450° C. Although the alloy bonding material may be selected from the group consisting of gold-silicon, gold-tin, silver-tin, silver-antimony-tin and mixtures thereof, it is preferably a silver-tin alloy. The silver-tin alloy bonding material preferably consists essentially of about 20 to about 40 wt. % silver and the balance essentially tin. More preferably, the composition of this bonding material alloy consists essentially of about 25 to about 35 wt. % silver and the balance essentially tin. The bonding material is applied in a temperature range of about 350° to about 450° C. and preferably in a range of about 390° to about 410° C. An important quality of the bonding material is its ability to adhere to the substrate, the buffer component and the semiconductor die. In order to enhance this bonding, each of the components may, if desired, have an oxidation resistant layer or coating as described herein.

The substrate 14 is preferably formed of a metal or alloy but may be formed of any other material such as a ceramic or a cermet having a high coefficient of thermal expansion of more than about $140 \times 10^{-7}$ in/in/°C. Typically, the substrate material has a coefficient of thermal expansion of about $160 \times 10^{-7}$ in/in/°C. The substrate is preferably provided with a cavity 45 to receive a die 12. However, it is within the terms of the present invention to delete the cavity and attach the die onto the upper surface 47 of the substrate.

Figure 2:
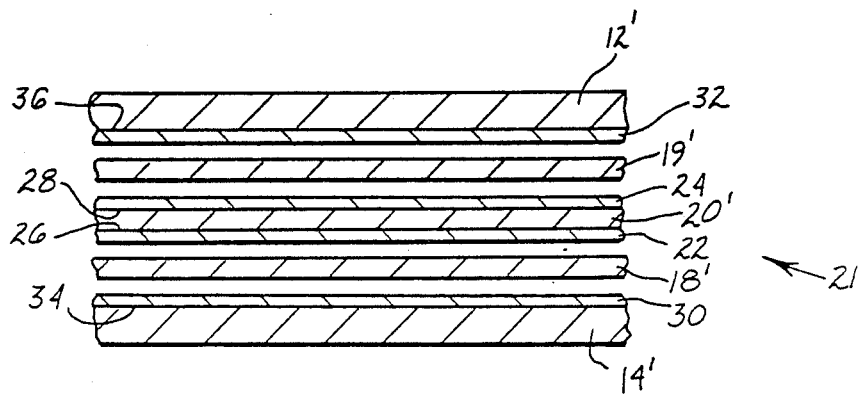
FIG. 2 illustrates a semiconductor die attach system incorporating oxidation resistant layers and a buffer layer.

Referring to FIG. 2, there is illustrated a semiconductor die attach system 21 with first and second oxidation resistant layers 22 and 24 provided on the opposite surfaces 26 and 28 of the buffer component 20'. Further, oxidation resistant layers 30 and 32 are provided on surfaces 34 and 36 of the substrate 14' and chip 12', respectively. The oxidation resistant layers enhance the strength of the bond between the bonding material 18' and 19' and the buffer component, the substrate and the chip. These layers or coatings are typically formed of a material selected from the group consisting of gold, silver, palladium, platinum and alloys thereof. It is also within the scope of the present invention to plate an oxidation resistant layer directly onto an intermediate barrier layer provided on the surface of the components as described herein.

To improve the adherence of the die 12' to seal component 19', a fourth oxidation resistant layer 32 may be coated on the surface 36 of the die. This layer is preferably selected from the materials which are used to form the oxidation resistant layers on the buffer component 20'. Typically, this material would be the same as the other oxidation resistant layers used throughout the die attach system.

Referring to FIG. 3, there is illustrated the semiconductor die attach system 40 with first and second barrier layers 42 and 44 on opposing surfaces 26" and 28" of the buffer component 20". The barrier layer has been found to be particularly useful to prevent the formation of oxides on the surface to which it is applied. For example, a barrier layer on opposite bonding surfaces of a nickel-iron buffer component prevents the formation of iron oxides on the surface of the component. These oxides could inhibit the bonding strength of the bonding material to the buffer component. The barrier layer may be used in conjunction with the oxidation resistant coating because the latter may not prevent oxygen from passing therethrough. For example, if silver alone were used to plate the buffer component 20", under certain bonding conditions, it would not be a strong hinderance to the interaction of oxygen with the buffer component. The result would be the formation of oxides, such as iron oxide which could leak through the oxidation resistant layers 22",24" and weaken the bond within the bonding material 18",19". The barrier layer 38 may also be coated on the surface 34' of substrate 14". It is further within the terms of the invention to selectively provide the barrier layer on any surface as desired.

Figure 4:
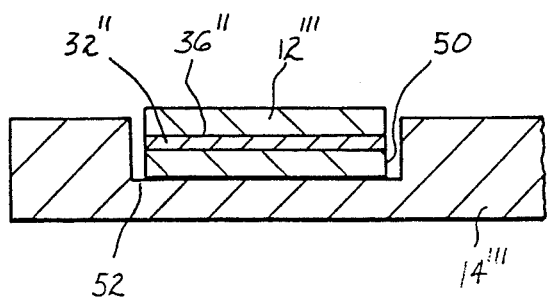
FIG. 4 illustrates a semiconductor die attach system with a silver-tin solder for attaching a die to a substrate.

In another embodiment, as illustrated in FIG. 4, the buffer component is deleted and the semiconductor die 12''' is bonded to the substrate 14''' with only a bonding material 50. It is now thought that the bonding material alone, if it is compliant enough to withstand thermal shock testing, can adequately dissipate thermal stress from thermal cycling. However, the buffer component is still advantageous in the system because it distributes stress over the greater thickness of buffer material, as compared to the bonding material above. The preferred bonding material 50 is a silver-tin alloy having a composition which consists essentially of about 20 to about 40 wt. % silver and the balance essentially tin. Preferably, the composition of the alloy bonding material consists essentially of about 25 to about 35 wt. % silver and the balance essentially tin. The silver-tin alloy is preferably free of antimony. However, it may have up to but not including 10% antimony as long as the silver-tin alloy is compliant enough for the die attachment to withstand thermal shock testing.

Preferably, the bonding material is processed in a temperature range of about 350° C. to about 450° C. and most preferably in a range of about 390° C. to about 410° C. With a silver-tin bonding material, the die attach surface 36" is preferably coated with an oxidation resistant layer 32" because the silver-tin does not easily wet the silicon or other materials of which the die is typically formed. An important aspect of this invention is to provide a thick enough layer of the bonding material 50 to dissipate thermal stresses generated by the mismatch in the coefficients of thermal expansion of the die and the substrate. The thickness of the bonding layer is preferably between about 1 to about 15 mils.

In order for the bonding component to satisfactorily bond to the substrate 14''', it may be desirable to coat surface 52 with an oxidation resistant layer of material as described above in the specification. Further, a buffer layer of the material described in the embodiment illustrated in FIG. 3 may be disposed between the oxidation layer and the substrate surface if desired. Embodiments within this scope are illustrated in FIGS. 2 and 3 after the removal of the buffer 20' or 20".

Figure 5:
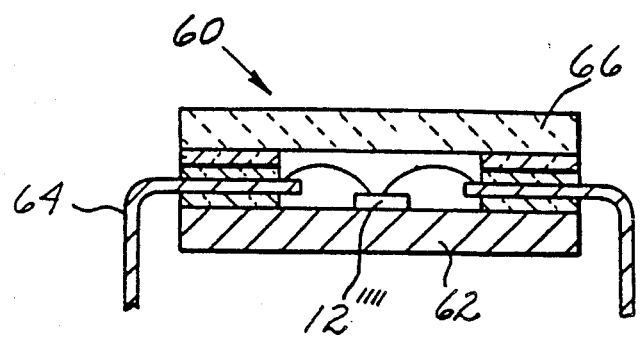
FIG. 5 illustrates a semiconductor package.

FIG. 5 illustrates a semiconductor package 60 which may incorporate the semiconductor die attach systems disclosed herein. The semiconductor die package 60 includes a substrate or base 62, a leadframe 64 and a cover 66. The leadframe 64 is glass sealed between the base 62 and the cover 66. A semiconductor device 12'''' is bonded to the base 62 by any of the semiconductor die attach systems disclosed herein. For example, a die attache system, such as a bonding material and buffer component bond the die 12'''' to the base 62 as described with regards to the embodiment illustrated in FIG. 1. Further, oxidation resistant layers may be disposed on either side of the buffer component as well as on the die 12'''' and the base 62 as disclosed with regards to the embodiment illustrated in FIG. 2. It is also within the terms of the present invention to incorporate barrier layers between the buffer component and the oxidation resistant layers as described with respect to the embodiment illustrated in FIG. 3. Moreover, if desired, the semiconductor die 12'''' can be bonded to the base 62 with any of the bonding materials described herein.

The patents and publications set forth in this application are intended to be incorporated by reference herein.

It is apparent that there has been provided in accordance with the present invention a semiconductor die attach system and process of using the system which fully satisfies the objects, means and advantages set forth hereinabove. While the invention has been described in combination with the embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A semiconductor die attach system adapted for attaching a semiconductor die to a substrate, comprising:
   a substrate having an oxidation resistant layer on a surface adapted to have the semiconductor die attached thereto, said oxidation resistant layer being of a material selected from the group consisting of gold, silver, palladium, platinum and alloys thereof, said substrate further having a barrier layer between said oxidation resistant layer and said substrate, said barrier layer being of a material selected from the group consisting of nickel, cobalt and alloys thereof;
   a semiconductor die having an oxidation resistant layer on a surface;
   means disposed between and bonded to said substrate and said semiconductor die for dissipating thermal stress from thermal cycling of said substrate and die, the thermal stress dissipating means comprising:
   a thin buffer component having a coefficient of thermal expansion of between about $35 \times 10^{-7}$ to about $100 \times 10^{-7}$ in/in/°C.;
   bonding means for bonding said buffer component to said substrate and to said surface of said die having said oxidation resistant layer, said bonding means comprising first and second layers of bonding material disposed against opposite bonding surfaces of said buffer component, said bonding material being an alloy of silver-tin having from about 20% by weight to about 40 % by weight silver;
   first and second oxidation resistant layers arranged between said first and second layers of bonding material and said opposite bonding surfaces of said buffer component, said first and second oxidation resistant layers being selected from the group consisting of gold, silver, palladium, platinum and alloys thereof; and
   first and second barrier layers arranged between said first and second oxidation resistant layers, respectively, and said buffer component, said first and second barrier layers being selected from the group consisting of nickel, cobalt and alloys thereof.

2. The die attach system of claim 1 wherein said buffer component has a thickness of between about 1 to about 20 mils.

3. The die attach system of claim 2 wherein said buffer component has a coefficient of thermal expansion of about $4 \times 10^{-7}$ to about $80 \times 10^{-7}$ in/in/°C.

4. The die attach system of claim 3 wherein said buffer component is constructed of a material selected from the group consisting of tungsten, rhenium, molybdenum, alloys thereof, nickel-iron alloys and ceramics.

5. The die attach system of claim 4 wherein said substrate has a coefficient of thermal expansion of more than about $140 \times 10^{-7}$ in/in/°C., said substrate being a material selected from the group consisting of metals, alloys, ceramics and cermets.

6. The die attach system of claim 1 wherein said bonding material has a melting temperature in the range of from about 390° C. to about 410° C.

* * * * *